US009974177B2

(12) United States Patent
Preuschl et al.

(10) Patent No.: US 9,974,177 B2
(45) Date of Patent: May 15, 2018

(54) OPTOELECTRONIC ASSEMBLY AND METHOD FOR PRODUCING AN OPTOELECTRONIC ASSEMBLY

(71) Applicant: OSRAM GmbH, Munich (DE)

(72) Inventors: Thomas Preuschl, Sinzing (DE); Peter Sachsenweger, Zeitlarn (DE)

(73) Assignee: OSRAM GmbH, Munich (DE)

( * ) Notice: Subject to any disclaimer, the term of this patent is extended or adjusted under 35 U.S.C. 154(b) by 224 days.

(21) Appl. No.: 14/781,603

(22) PCT Filed: Jan. 30, 2014

(86) PCT No.: PCT/EP2014/051843
§ 371 (c)(1),
(2) Date: Dec. 1, 2015

(87) PCT Pub. No.: WO2014/161680
PCT Pub. Date: Oct. 9, 2014

(65) Prior Publication Data
US 2016/0143144 A1    May 19, 2016

(30) Foreign Application Priority Data
Apr. 4, 2013   (DE) .................. 10 2013 205 998

(51) Int. Cl.
*H05K 7/00* (2006.01)
*H05K 1/18* (2006.01)
(Continued)

(52) U.S. Cl.
CPC .............. *H05K 1/18* (2013.01); *F21K 9/20* (2016.08); *F21K 9/90* (2013.01); *F21V 15/01* (2013.01);
(Continued)

(58) Field of Classification Search
CPC ... F21K 9/20; F21K 9/90; F21V 15/01; F21V 17/10; F21V 17/101; F21V 19/0035;
(Continued)

(56) References Cited

U.S. PATENT DOCUMENTS 9,341,361 B2*   5/2016  Diekmann .............. F21V 15/01
2008/0123341 A1*  5/2008  Chiu .................. F21K 9/233
                                                     362/294

(Continued)

FOREIGN PATENT DOCUMENTS

CN            102639931 A      8/2012
DE    10 2009 047 520 A1       6/2001
(Continued)

OTHER PUBLICATIONS

International Search Report based on Application No. PCT/EP2014/051843 (16 Pages) dated Mar. 5, 2014 (Reference Purpose Only).
(Continued)

*Primary Examiner* — Yuriy Semenenko
(74) *Attorney, Agent, or Firm* — Viering Jentschura & Partner MBB

(57) ABSTRACT

Various embodiments may relate to an optoelectronic assembly, including a printed circuit board, which has a first and a second sides, a central cutout, at least one contact cutout and, at least one connection location, a carrier element coupled to the printed circuit board, has a first side and at least one contact location, at least one optoelectronic component arranged on the first side of the carrier element in such a way that it is exposed in the central cutout of the printed circuit board, a housing body, which has a central cutout and which is formed and physically coupled to the printed circuit board such that the optoelectronic component is exposed in the central cutout, and at least one contact element arranged on an inner side of the housing body is
(Continued)

formed such that the contact element electrically couples the contact location of the carrier element to the connection location.

15 Claims, 6 Drawing Sheets

(51) Int. Cl.
| | | |
|---|---|---|
| *F21V 15/01* | (2006.01) | |
| *F21V 17/10* | (2006.01) | |
| *F21V 19/00* | (2006.01) | |
| *F21V 23/06* | (2006.01) | |
| *H05K 3/32* | (2006.01) | |
| *F21K 9/90* | (2016.01) | |
| *F21K 9/20* | (2016.01) | |
| *F21V 23/00* | (2015.01) | |
| *F21V 29/00* | (2015.01) | |
| *F21V 29/507* | (2015.01) | |
| *F21Y 105/00* | (2016.01) | |
| *F21Y 105/10* | (2016.01) | |
| *F21Y 115/10* | (2016.01) | |
| *F21Y 115/15* | (2016.01) | |

(52) U.S. Cl.
CPC ............ *F21V 17/10* (2013.01); *F21V 17/101* (2013.01); *F21V 19/0035* (2013.01); *F21V 23/006* (2013.01); *F21V 23/06* (2013.01); *H05K 3/32* (2013.01); *F21V 29/20* (2013.01); *F21V 29/507* (2015.01); *F21Y 2105/00* (2013.01); *F21Y 2105/10* (2016.08); *F21Y 2115/10* (2016.08); *F21Y 2115/15* (2016.08); *H05K 1/182* (2013.01); *H05K 2201/0311* (2013.01); *H05K 2201/049* (2013.01); *H05K 2201/09072* (2013.01); *H05K 2201/10106* (2013.01); *H05K 2201/10189* (2013.01); *H05K 2201/10962* (2013.01)

(58) Field of Classification Search
CPC ........ F21V 23/006; F21V 23/06; F21V 29/20; F21V 29/507; F21Y 2105/00; F21Y 2105/10; F21Y 2115/10; F21Y 2115/15
See application file for complete search history.

(56) References Cited

U.S. PATENT DOCUMENTS

| | | | |
|---|---|---|---|
| 2009/0237942 A1* | 9/2009 | Lam .................. | H01L 33/58 362/308 |
| 2011/0063849 A1* | 3/2011 | Alexander ........... | F21S 48/328 362/294 |
| 2011/0136374 A1 | 6/2011 | Mostoller et al. | |
| 2011/0278632 A1 | 11/2011 | Takei et al. | |
| 2012/0243232 A1 | 9/2012 | Bertram et al. | |
| 2012/0268953 A1 | 10/2012 | Breidenassel et al. | |
| 2012/0293997 A1* | 11/2012 | Zaderej .............. | F21V 29/20 362/235 |
| 2015/0055356 A1* | 2/2015 | Derks ................ | H01R 13/24 362/418 |
| 2015/0131299 A1* | 5/2015 | Meyer ................ | F21V 17/10 362/373 |
| 2015/0300616 A1* | 10/2015 | Buhl ................. | F21L 4/00 362/205 |

FOREIGN PATENT DOCUMENTS

| | | |
|---|---|---|
| JP | 2011238793 A | 11/2011 |
| WO | 2012055852 A1 | 5/2012 |
| WO | 2012148910 A2 | 11/2012 |
| WO | 2013017984 A1 | 2/2013 |

OTHER PUBLICATIONS

Chinese Office Action based on application No. 201480019836.4 (6 pages + 2 pages German translation of the Search Report) dated Sep. 4, 2017 (for reference purpose only).

\* cited by examiner

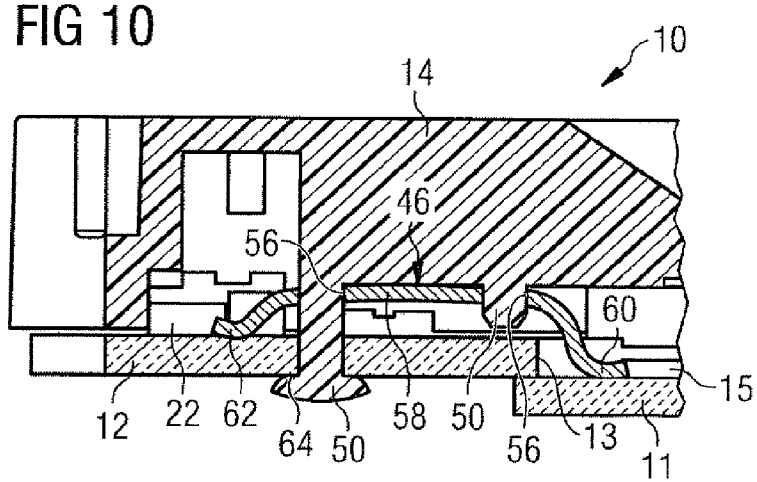
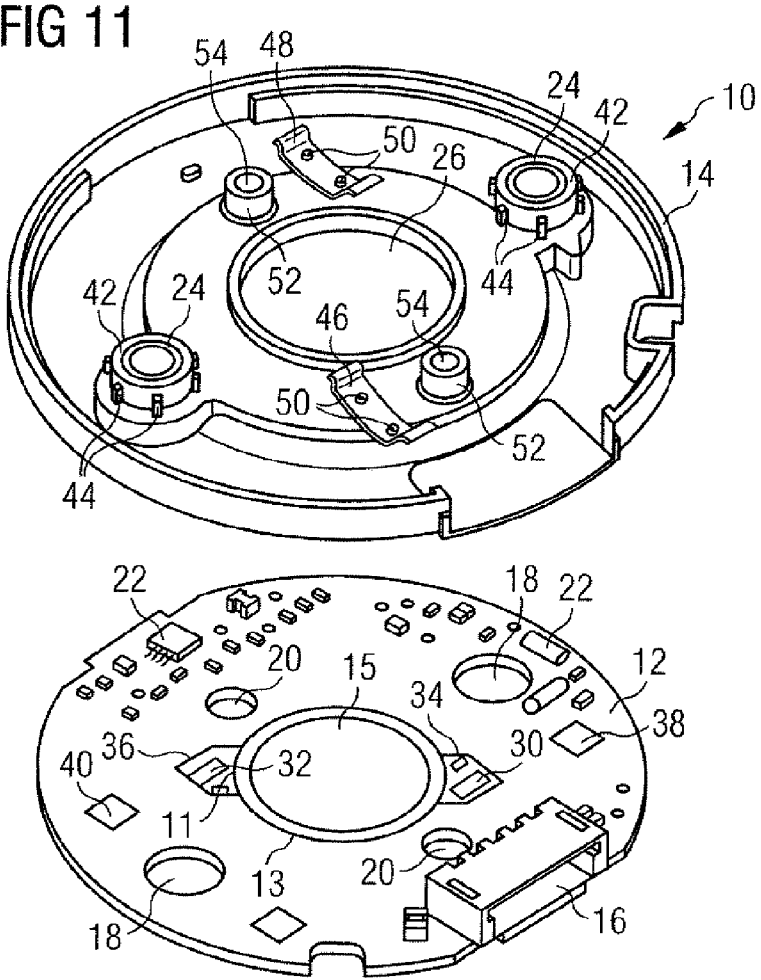

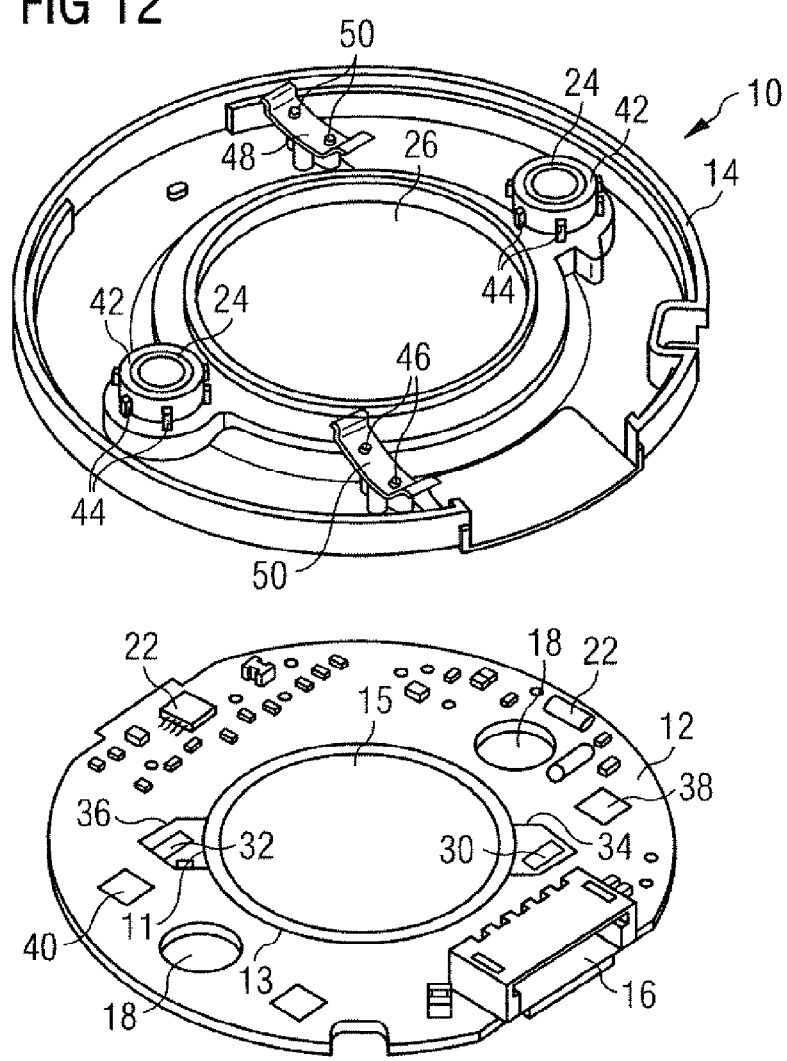

OPTOELECTRONIC ASSEMBLY AND METHOD FOR PRODUCING AN OPTOELECTRONIC ASSEMBLY

RELATED APPLICATIONS

The present application is a national stage entry according to 35 U.S.C. § 371 of PCT application No.: PCT/EP2014/051843 filed on Jan. 30, 2014 which claims priority from German application No.: 10 2013 205 998.1 filed on Apr. 4, 2013, and is incorporated herein by reference in its entirety.

TECHNICAL FIELD

Various embodiments may relate to an optoelectronic assembly and to a method for producing an optoelectronic assembly.

BACKGROUND

In a conventional optoelectronic assembly, an optoelectronic component is arranged on a carrier element and is electrically connected to contact locations on the carrier element. The carrier element and a printed circuit board are arranged on a holding body, for example are fixedly adhesively bonded thereon. The contact locations of the carrier can be connected to connection locations of the printed circuit board, for example by insulated wires that can be fixedly soldered to the contact locations and to the connection locations. A housing, which can be produced in an injection molding method, for example, can be fixed to the printed circuit board and/or the holding body. The fixing can be carried out for example by adhesive bonding and/or a plug connection or latching connection. The housing serves for example as protection for electronic components and/or electrical contacts or connections of the optoelectronic assembly against external influences, such as impacts and/or moisture, for example.

After completion, the optoelectronic assembly can then be mounted for its part on a mounting body, for example by clipping, screwing, riveting or adhesive bonding. For screwing, for example, mounting cutouts can be provided in the optoelectronic assembly, which mounting cutouts can extend through the housing and the printed circuit board. In particular, the holding body can be thermally coupled to a heat sink or a heat spreader, for example using an adhesive having good thermal conductivity.

The optoelectronic assembly can for example comply with the Zhaga standard. Defined interface specifications are stipulated in the Zhaga standard. This ensures the interchangeability of LED light sources from different manufacturers.

Heat arises during the operation of the optoelectronic assembly, which heat can be dissipated for example via the carrier element and the holding body toward the heat sink or the heat spreader. In this case, in principle, the adhesive-bonding connections between the carrier element and the holding body and between the holding body and the heat sink or the heat spreader form a high thermal resistance, which disadvantageously impairs the dissipation of heat.

Furthermore, soldering the insulated wires onto the contact locations and connection locations is relatively complex, for example time-consuming and/or cost-intensive, and the insulated wires themselves can be relatively expensive.

SUMMARY

In various embodiments, an optoelectronic assembly is provided which is producible simply and/or cost-effectively, for example by an optoelectronic component of the optoelectronic assembly being electrically contactable simply and/or cost-effectively, and/or which contributes to effective operation of electronic and/or optoelectronic components of the optoelectronic assembly, for example by good dissipation of heat being ensured during operation.

In various embodiments, a method for producing an optoelectronic assembly is provided which is implementable simply and/or cost-effectively, for example by an optoelectronic component of the optoelectronic assembly being electrically contactable simply and/or cost-effectively, and/or which contributes to electronic and/or optoelectronic components of the optoelectronic assembly being able to be operated effectively, for example by good dissipation of heat being ensured during operation.

In various embodiments, an optoelectronic assembly is provided. A printed circuit board of the optoelectronic assembly has a first side of the printed circuit board, a second side of the printed circuit board facing away from the first side, a central cutout of the printed circuit board, at least one contact cutout and, on the first side of the printed circuit board, at least one connection location. A carrier element of the optoelectronic assembly is physically coupled to the printed circuit board, has a first side of the carrier element, said first side facing the second side of the printed circuit board, and has at least one contact location on the first side of the carrier element. The contact location of the carrier element is exposed in the contact cutout of the printed circuit board. At least one optoelectronic component of the optoelectronic assembly is electrically coupled to the contact location via the carrier element and is arranged on the first side of the carrier element in such a way that it is exposed in the central cutout of the printed circuit board. A housing body of the optoelectronic assembly has a central cutout and is formed and physically coupled to the printed circuit board in such a way that the optoelectronic component is exposed in the central cutout of the housing body. At least one contact element of the optoelectronic assembly is arranged on an inner side of the housing body and is formed in such a way that the contact element electrically couples the contact location of the carrier element to the connection location of the printed circuit board.

The contact location of the carrier element, which contact location is exposed in the contact cutout, and the connection of the contact location of the carrier element to the connection location of the printed circuit board via the contact element contribute to simple and rapid electrical contacting of the optoelectronic component and thus to simple and cost-effective production of the optoelectronic assembly.

Fixing the carrier element directly to the printed circuit board makes it possible to dispense with the holding body, as a result of which a work step is obviated and material expenditure can be saved. Furthermore, only one adhesive layer can be formed between the carrier element and a heat sink and/or a heat spreader to which the optoelectronic assembly can be fixed, as a result of which only one thermal resistance is formed since the holding body and the further adhesive layer associated therewith between the carrier element and the heat sink or the heat spreader can be dispensed with. This contributes to the fact that heat that arises during the operation of the optoelectronic assembly can be rapidly dissipated from the optoelectronic component, which contributes to effective operation of the optoelectronic assembly.

In addition to the at least one contact location, by way of example, one, two or more further contact locations can be formed on the carrier element. Correspondingly, two or more contact cutouts in the printed circuit board, connection locations on the printed circuit board and corresponding contact elements can be formed and arranged.

The contact element or contact elements can for example include a metal or be formed therefrom. By way of example, the contact elements can include a corrosion-resistant alloy.

In various embodiments, the contact element has a middle section, via which the contact element is fixed to the housing body, a second end section, which projects from the housing body and which is coupled to the connection location, and a first end section, which projects from the housing body and which is coupled to the contact location. By way of example, the contact element has a U-shape having round or angular transitions and/or an arcuate shape. By way of example, the contact element is formed in a concave fashion, as viewed from the housing body. This can contribute to the contact element being able to be fixed to the housing simply and securely and/or the connection location of the printed circuit board and the contact location of the carrier element being able to be contacted to simply and securely.

In various embodiments, the contact element is formed as a spring element. By way of example, the contact element is formed in such a way that, with the housing body not arranged on the printed circuit board, said contact element, at its end sections, projects further from the inner side of the housing body than, with the housing body arranged on the printed circuit board, the size of a clearance between the inner side of the housing body and the connection location or the contact location. This has the effect that the contact element is elastically deformed when the housing body is arranged on the printed circuit board, and is under mechanical stress in the completed optoelectronic assembly. This has the effect that the end sections of the contact element are pressed with a moderate force against the connection location of the printed circuit board or the contact location of the carrier element, thereby ensuring a good and secure electrical coupling of the connection location to the contact location, even if the optoelectronic component, for example the housing body and/or the printed circuit board, deforms during operation on account of different coefficients of thermal expansion of the materials used and/or as the operating period increases.

In various embodiments, the housing body has at least one holding pin on its inner side, and the contact element has a holding cutout of the contact element. The holding pin projects through the holding cutout of the contact element. The holding pin and the holding cutout can contribute to the contact element being fixed to the housing body in a simple manner. In particular, by the holding pins, it is possible to ensure a suitable positioning, orientation and/or alignment of the contact element with respect to the housing body and thus subsequently with respect to the connection location and the contact location. Alternatively or additionally, the contact element can be fixedly adhesively bonded to the housing body. Furthermore, in addition to the holding pin, one, two or more further holding pins can be formed on the inner side of the housing body. Correspondingly, two or more further holding cutouts can be formed in the contact element.

In various embodiments, the printed circuit board has a holding cutout of the printed circuit board. The holding pin projects through the holding cutout of the printed circuit board. This can contribute to the housing body being fixed to the printed circuit board in a simple manner. If two or more holding pins are formed on the inner side of the housing body, two or more corresponding holding cutouts of the printed circuit board can also be formed.

In various embodiments, the part of the holding pin which projects through the holding cutout of the contact element is formed with an interference fit with respect to the holding cutout of the contact element. Alternatively or additionally, the part of the holding pin which projects through the holding cutout of the printed circuit board is formed with an interference fit with respect to the holding cutout of the printed circuit board. By way of example, that part of the holding pin which projects through the corresponding holding cutout can be permanently deformed in such a way that the interference fit is provided. By way of example, the corresponding part of the holding pin can be deformed under thermal action, for example by hot embossing (hot stamp).

In various embodiments, the holding pin projects through the holding cutout of the printed circuit board to an extent such that an end section of the holding pin is flush with a second side of the carrier element facing away from the first side of the carrier element. This has the effect that when the optoelectronic assembly is arranged on a further body, for example the heat sink or the heat spreader, the holding pin and the second side of the carrier element are in contact with the corresponding body. This can contribute to keeping small or preventing bending of the optoelectronic assembly when the optoelectronic assembly is connected to the corresponding body.

In various embodiments, the housing body has at least one mounting cutout of the housing body which is formed in such a way that a wall of the mounting cutout of the housing body projects through a mounting cutout of the printed circuit board. This can contribute to the housing body being connected to the printed circuit board. Furthermore, this can contribute to the housing body being aligned, oriented and/or positioned as intended relative to the printed circuit board.

In various embodiments, the wall projects through the mounting cutout of the printed circuit board to an extent such that an end section of the wall is flush with a second side of the carrier element facing away from the first side of the carrier element. This has the effect that when the optoelectronic assembly is arranged on the further body, for example the heat sink or the heat spreader, the wall and the second side of the carrier element are in contact with the corresponding body. This can contribute to keeping small or preventing bending of the optoelectronic assembly when the optoelectronic assembly is connected to the corresponding body.

In various embodiments, mounting ribs are formed on an outer side of the wall, wherein the outer side of the wall between the mounting ribs is formed with a clearance fit with respect to the mounting cutout of the printed circuit board, and the mounting ribs are formed in accordance with an interference fit with respect to the mounting cutout of the printed circuit board. The clearance fit of the wall with respect to the mounting cutout of the printed circuit board has the effect that the wall is insertable into the mounting cutout of the printed circuit board in a simple manner. The interference fit of the mounting ribs with respect to the mounting cutout of the printed circuit board has the effect that there is a force-locking connection, for example by a press fit, between the wall and the mounting cutout of the printed circuit board via the mounting ribs. This can contribute to the housing body being fixedly connected to the printed circuit board in a simple manner.

In various embodiments, the housing body has on its inner side at least one fixing pin which is formed in such a way that it projects through a fixing cutout of the printed circuit board. The fixing pin can be formed as an alternative or in addition to the mounting cutout of the housing body and can correspondingly contribute, as an alternative or in addition to the mounting cutout of the housing body, to the housing body being able to be simply and/or correctly oriented, correctly positioned and/or correctly aligned with the printed circuit board.

In various embodiments, the fixing pin projects through the fixing cutout of the printed circuit board to an extent such that an end section of the fixing pin is flush with a second side of the carrier element facing away from the first side of the carrier element. This has the effect that when the optoelectronic assembly is arranged on the further body, for example the heat sink or the heat spreader, the fixing pin and the second side of the carrier element are in contact with the corresponding body. This can contribute to keeping small or preventing bending of the optoelectronic assembly when the optoelectronic assembly is connected to the corresponding body.

In various embodiments, the contact cutout opens into the central cutout of the printed circuit board. In other words, the contact cutout and the central cutout of the printed circuit board can be formed integrally. In still other words, a cutout of the printed circuit board can be formed which includes the contact cutout and the central cutout. In still other words, the contact location and the optoelectronic component can be exposed in a common cutout of the printed circuit board.

In various embodiments, a method for producing an optoelectronic assembly is provided, wherein a carrier element is provided, which has a first side of the carrier element and at least one contact location on the first side of the carrier element. At least one optoelectronic component is arranged on the first side of the carrier element and is electrically coupled to the two contact locations of the carrier element via the carrier element. A printed circuit board is provided, which has a first side of the printed circuit board, a second side of the printed circuit board facing away from the first side of the printed circuit board, a central cutout, at least one contact cutout and, on the first side of the printed circuit board, at least one connection location. The carrier element is physically coupled to the printed circuit board in such a way that the first side of the carrier element faces the second side of the printed circuit board, that the optoelectronic component is exposed in the central cutout of the printed circuit board, and that the contact location of the carrier element is exposed in the contact cutout of the printed circuit board. A housing body is provided, which has a central cutout and on the inner side of which at least one electrically conductive contact element is arranged. The housing body is physically coupled to the printed circuit board in such a way that the optoelectronic component is exposed in the central cutout of the housing body, and the contact element electrically couples the contact location of the carrier element to the connection location of the printed circuit board.

The fact that the carrier element is provided can mean, for example, that the carrier element is arranged as a finished component or that the carrier element is formed. The fact that the printed circuit board is provided can mean, for example, that the printed circuit board is arranged as a finished component or that the printed circuit board is formed. The fact that the housing body is provided can mean, for example, that the housing body is arranged as a finished component or that the housing body is formed.

In various embodiments, the contact element is fixed to the housing body by a holding pin of the housing body and a holding cutout of the contact element corresponding thereto. Optionally, a part of the holding pin that projects from the holding cutout of the contact element can be permanently deformed, for example by hot embossing, as a result of which, for example, an interference fit with respect to the holding cutout of the contact element and thus a connection between the contact element and the housing body that is not releasable without destruction can be produced.

BRIEF DESCRIPTION OF THE DRAWING

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 10 shows a sectional illustration through one embodiment of an optoelectronic assembly;

FIG. 11 shows a perspective view of one embodiment of an inner side of a housing body and of a printed circuit board, of a carrier element and of an optoelectronic component; and FIG. 12 shows a perspective view of one embodiment of an inner side of a housing body and of a printed circuit board, of a carrier element and of an optoelectronic component.

DETAILED DESCRIPTION

Figure 1:
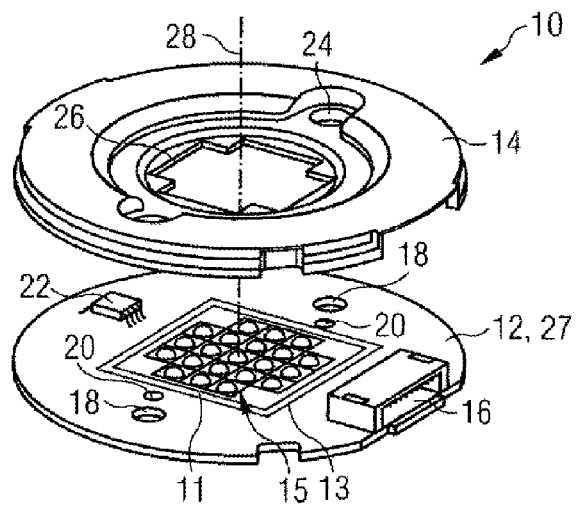
FIG. 1 shows an exploded illustration of an optoelectronic assembly in accordance with the prior art.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise.

Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

An optoelectronic assembly can include one, two or more optoelectronic components and a printed circuit board and/or a carrier, on which the optoelectronic component is arranged and/or to which the optoelectronic component is electrically coupled. Optionally, an optoelectronic assembly can also include one, two or more electronic components. An electronic component can include for example an active and/or a passive component. An active electronic component can include for example a computing, control and/or regulating unit and/or a transistor. A passive electronic component can include for example a capacitor, a resistor, a diode or a coil.

In various embodiments, an optoelectronic component can include an electromagnetic radiation emitting component or an electromagnetic radiation absorbing component. An electromagnetic radiation absorbing component can be a solar cell, for example. In various embodiments, an electromagnetic radiation emitting component can be an electromagnetic radiation emitting semiconductor component and/or be embodied as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this context, the electromagnetic radiation emitting component can be embodied for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

The connection of a first body to a second body can be positively locking, force locking and/or cohesive. The connections can be embodied as releasable, i.e. reversible. In various configurations, a reversible, close connection can be realized for example as a screw connection, a clamping, a latching connection and/or by clips and/or holding pins. However, the connections can also be embodied as non-releasable, i.e. irreversible. In this case, a non-releasable connection can be separated only by the connection means being destroyed. In various configurations, an irreversible, close connection can be realized for example as a riveted connection, an adhesively bonded connection or a soldered connection.

In the case of a positively locking connection, the movement of the first body can be restricted by a surface of the second body, wherein the first body moves perpendicularly, i.e. normally, in the direction of the restricting surface of the second body. In other words, in the case of a positively locking connection, a relative movement of the two bodies is prevented on account of their mutually corresponding shape in at least one direction. A hook in an eye can be restricted in movement for example in at least one spatial direction. In various configurations, a positively locking connection can be realized for example as a screw connection, a hook and loop fastener, a clamping, a latching connection and/or by clips. Furthermore, a positively locking connection can be formed by an interference fit of a first body with respect to a second body. By way of example, an end section of a holding pin which is led through a holding cutout can be deformed in such a way that its cross section is larger than the holding cutout and it can no longer be led back through the holding cutout.

In the case of a force-locking connection, on account of a physical contact of the two bodies under pressure, a static friction can restrict a movement of the first body parallel to the second body. One example of a force-locking connection may be, for example, a bottle cork in a bottle neck or a dowel with an interference fit in a corresponding dowel hole. Furthermore, the force-locking connection can be formed by a press fit between a first body and a second body. By way of example, a diameter of the holding pin can be chosen such that it can still just be inserted into the holding cutout with deformation of the holding pin and/or of the corresponding holding cutout, but can be removed again from the latter only with increased expenditure of force.

In the case of a cohesive connection, the first body can be connected to the second body by atomic and/or molecular forces. Cohesive connections can often be non-releasable connections. In various configurations, a cohesive connection can be realized for example as an adhesively bonded connection, a solder connection, for example of a glass solder or of a metal solder, or as a welded connection.

In the case of a clearance fit, a body inserted into a cutout has smaller external dimensions than the internal dimensions of the cutout. In other words, there is at least a small gap between a wall of the cutout and the body arranged therein. The body is thus insertable into the cutout and/or removable therefrom in a simple manner. In the case of an interference fit, a body inserted into a cutout has larger external dimensions than the internal dimensions of the cutout. The body is thus insertable into the cutout and/or removable therefrom only with increased effort. The increased effort can be, for example, that the body and/or the cutout are/is deformed, that much force has to be expended and/or that the body has to be cooled in order for it to fit into the cutout. The interference fit can also be referred to as a press fit.

FIG. 1 shows an optoelectronic assembly 10 in accordance with the prior art in an exploded illustration. The optoelectronic assembly 10 in accordance with the prior art can comply with the Zhaga standard, for example. The optoelectronic assembly 10 in accordance with the prior art includes a printed circuit board 12 and a carrier element 11 on a holding body 27, an optoelectronic component 15 on the carrier element 11, and a housing body 14.

A first side of the printed circuit board 12 faces the housing body 14. A second side of the printed circuit board 12 facing away from the first side faces a first side of the holding body 27. The printed circuit board 12 can be fixed to the holding body 27 by a cohesive connection, for example. By way of example, the printed circuit board 12 can be fixed to the holding body 27 by an adhesive-bonding connection, the material of the printed circuit board 12 can be formed directly on the holding body 27 and/or the printed circuit board 12 can be laminated onto the holding body 27. The printed circuit board 12 has electrically conductive conductor tracks (not shown), which, for example, can be formed at least partly on the first side of the printed circuit board 12.

The printed circuit board 12 furthermore has connection locations (not shown in FIG. 1) that are electrically coupled to the conductor tracks. The printed circuit board 12 has a central cutout 13 of the printed circuit board 12.

The carrier element 11 is arranged in the central cutout 13 of the printed circuit board 12 and on the holding body 27. The carrier element 11 has a first side of the carrier element 11 and a second side of the carrier element 11 facing away from the first side of the carrier element 11. The second side of the carrier element 11 can face the holding body 27, for example. The carrier element 11 can be fixed to the printed circuit board 12 for example by a cohesive connection, for example an adhesive-bonding connection.

A plug element 16 is arranged on the first side of the printed circuit board 12. The plug element 16 has a plug body and electrically conductive plug contacts, which, for example, are partly arranged in the plug body and are electrically coupled to the conductor tracks.

The optoelectronic component 15 is arranged on the carrier element 11. By way of example, a plurality of optoelectronic components 15 are arranged on the carrier element 11. The optoelectronic component 15 is electrically coupled to contact locations (not shown in FIG. 1) of the carrier element 11. The contact locations of the carrier element 11 can be electrically coupled to the conductor tracks of the printed circuit board 12 for example by one, two or more insulated cables. By way of example, optoelectronic components 15 that emit light having different colors can be arranged. By way of example, the optoelectronic components 15 can emit red, green, blue and/or white light.

Furthermore, the optoelectronic component or optoelectronic components 15 can at least partly include conversion elements for converting the wavelengths of the electromagnetic radiation generated. By way of example, the optoelectronic components 15 can be covered with a layer including one or a plurality of phosphors as converter material. By way of example, the optoelectronic components 15 can be covered with a silicone layer including phosphor. The phosphors are suitable for converting light with respect to its wavelength. The phosphors are energetically excited with the aid of the electromagnetic radiation generated in the optoelectronic component 15, which radiation can also be designated as excitation light in this context. Upon the subsequent energetic deexcitation, the phosphors emit light of one or a plurality of predefined colors. Consequently, a conversion of the excitation radiation takes place, as a result of which conversion radiation is generated. During the conversion, the wavelengths of the excitation radiation are shifted to shorter or longer wavelengths. The colors can be individual colors or mixed colors. The individual colors can include green, red or yellow light, for example, and/or the mixed colors can be mixed from green, red and/or yellow light, for example, and/or include white light, for example. By way of example, green, red and yellow can be represented with the aid of blue excitation light. In addition, blue light can be provided, for example by the layer being formed in such a way that at least partly non-converted excitation radiation leaves the layer as usable illumination light. With the use of UV excitation light, the phosphors can also be chosen in such a way that they represent red, green, blue and yellow.

Customary phosphors are for example garnets or nitrides silicates, nitrides, oxides, phosphates, borates, oxynitrides, sulfides, selenides, aluminates, tungstates, and halides, of aluminum, silicon, magnesium, calcium, barium, strontium, zinc, cadmium, manganese, indium, tungsten and other transition metals, or rare earth metals such as yttrium, gadolinium or lanthanum which are doped with an activator such as, for example, copper, silver, aluminum, manganese, zinc, tin, lead, cerium, terbium, titanium, antimony or europium. In various embodiments, the phosphor is an oxidic or (oxy)nitridic phosphor such as a garnet, orthosilicate, nitrido(alumo)silicate, nitride or nitridoorthosilicate, or a halide or halophosphate. Specific examples of suitable phosphors are strontium chloroapatite:Eu ((Sr,Ca)5(PO4)3Cl:Eu; SCAP), yttrium aluminum garnet:cerium (YAG:Ce) or CaAlSiN3:Eu. Furthermore, the phosphor or phosphor mixture can contain, for example, particles having light-scattering properties and/or auxiliaries. Examples of auxiliaries include surfactants and organic solvents. Examples of light-scattering particles are gold, silver and metal oxide particles.

One, two or more electronic components 22 can be arranged on the first side of the printed circuit board 12. The electronic component 22 can be for example an active or a passive component. The active component can be for example a control and/or regulating unit. The passive component can be for example a thermoelement, a resistor, a capacitor or a coil. The electronic component 22 can be electrically coupled to the conductor tracks of the printed circuit board 12 for example by a non-releasable connection, for example by a soldering connection and/or by wire bonding.

The printed circuit board 12 can have mounting cutouts 18 of the printed circuit board 12, which can serve for fixing the optoelectronic assembly 10 to a mounting area (not illustrated), for example a heat sink or a heat spreader. Furthermore, the printed circuit board 12 can have fixing cutouts 20, for example, which can serve, for example, to receive fixing pins (not illustrated in FIG. 1) of the housing body 14, by which the housing body 14 can be aligned relative to the printed circuit board 12 and/or secured thereto for example in a simple manner. By way of example, the fixing pins can be secured in the corresponding connecting cutouts 20 in a force-locking manner by a press fit.

Furthermore, the housing body 14 can have mounting cutouts 24 of the housing body 14, for example, which, with the housing body 14 being arranged on the printed circuit board 12 as intended, for example, concentrically overlap the mounting cutouts 18 of the printed circuit board 12, such that they form common mounting cutouts of the optoelectronic assembly 10. Said common mounting cutouts can be used to fix the optoelectronic assembly 10 to the mounting area, for example by a releasable fixing means, for example by a screw connection. The mounting cutouts 24 of the housing body 14 can be reinforced for example with the aid of sleeves (not illustrated) that bear for example closely on the internal circumference of the mounting cutouts 24 of the housing body 14.

The housing body 14 furthermore has a central cutout 26 of the housing body 14, in which the optoelectronic component 15 is secured when the housing body 14 is arranged on the printed circuit board 12 as intended. The optoelectronic assembly 10 can be formed for example with regard to its outer shape such that it is largely rotationally symmetrical, for example roundish, for example circular, for example rotationally symmetrical about an axis 28 of symmetry. As an alternative thereto, however, the outer shape of the optoelectronic assembly 10 can also be formed differently, for example such that it is angular, for example quadrilateral, for example rectangular, for example square.

Figure 2:
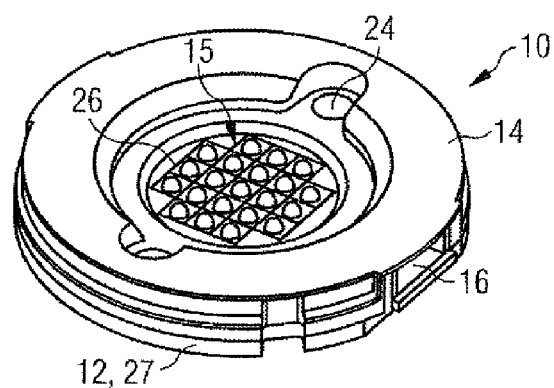
FIG. 2 shows a perspective view of the optoelectronic assembly in accordance with the prior art shown in FIG. 1.

FIG. 2 shows the optoelectronic assembly 10 in accordance with the prior art as shown in FIG. 1 with the housing body 14 arranged on the printed circuit board 12 as intended.

Figure 3:
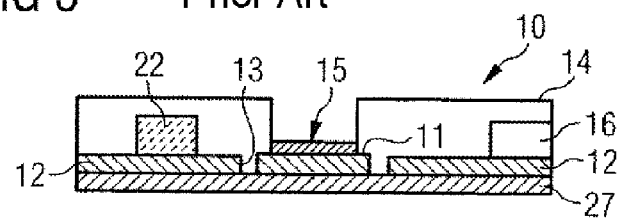
FIG. 3 shows a cross section through the optoelectronic assembly in accordance with the prior art as shown in FIG. 1.

FIG. 3 shows a sectional illustration of the optoelectronic assembly 10 in accordance with the prior art as shown in FIG. 2. The printed circuit board 12 and the carrier element 11 are arranged on the holding body 27. The printed circuit board 12, for example the first side of the printed circuit board 12, can serve for example for mechanically receiving and/or electrically contacting the electronic component 22 and/or the plug element 16. Furthermore, the printed circuit board 12 can serve for example for electrically contacting the optoelectronic component 15. The holding body 27 can serve for example for receiving the printed circuit board 12 and/or the carrier element 11, wherein the second side of the printed circuit board 12, said second side facing away from the first side of the printed circuit board 12, faces the holding body 27 and/or is physically coupled thereto. Furthermore, the holding body 27 can contribute for example to the mechanical stabilization of the optoelectronic assembly 10. Furthermore, the holding body 27 can serve as a heat sink for the optoelectronic component 15. In addition, the optoelectronic assembly 10 can be arranged on a heat sink (not illustrated) or a heat spreader (not illustrated).

The plug element 16, for example the plug contacts of the plug element 16, the optoelectronic component 15 and/or the electronic component 22 can be electrically coupled to one another for example by the conductor tracks, connection locations of the printed circuit board 12, contact locations of the carrier element 11 and/or cable connections (not illustrated). By way of example, control commands and/or electrical energy can be fed to the optoelectronic assembly 10 from outside via the plug element 16.

The optoelectronic assembly 10 in accordance with the prior art can furthermore include a sealing element (not illustrated), which protects for example the conductor tracks of the printed circuit board 12 and/or the electronic component 22 against moisture. The sealing element can be embodied for example in a cap-shaped fashion in cross section and can extend in a manner corresponding to the printed circuit board 12, for example in a circular fashion, over the entire printed circuit board 12.

Figure 4:
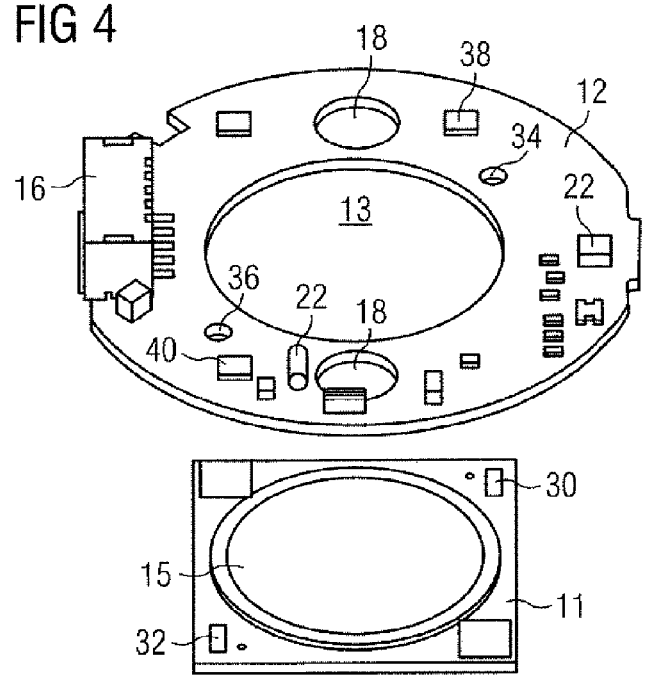
FIG. 4 shows an exploded illustration of one embodiment of a printed circuit board, of a carrier element and of an optoelectronic component.

FIG. 4 shows an exploded illustration of one embodiment of a printed circuit board 12 and of a carrier element 11 with an optoelectronic component 15. The printed circuit board 12, the carrier element 11 and the optoelectronic component 15 can for example largely correspond to the printed circuit board 12, the carrier element 11 and the optoelectronic component 15 respectively explained above. In contrast thereto, however, the printed circuit board 12 has contact cutouts, in particular a first contact cutout 34 and a second contact cutout 36. The first contact cutout 34 is formed adjacent to a first connection location 38 of the printed circuit board 12. The second contact cutout 36 is formed adjacent to a second connection location 40 of the printed circuit board 12. The connection locations 38, 40 of the printed circuit board 12 are electrically connected to the conductor tracks of the printed circuit board 12.

The carrier element 11 has contact locations, in particular a first contact location 30 and a second contact location 32. The contact locations 30, 32 of the carrier element 11 are electrically connected to the optoelectronic component 15 for example by conductor tracks (not illustrated) of the carrier element 11. When the printed circuit board 12 is arranged on the carrier element 11 as intended, the optoelectronic component 15 is exposed in the central cutout 13 of the printed circuit board 12, the first contact location 30 is exposed in the first contact cutout 34, and the second contact location 32 is exposed in the second contact cutout 36. Otherwise, the first side of the carrier element 11, said first side facing the printed circuit board 12, is covered by the printed circuit board 12 and can be fixed thereto for example by an adhesive-bonding connection. The optoelectronic component 15 can then be electrically coupled to the conductor tracks of the printed circuit board 12, the electronic component 22 and/or the plug element 16 via the connection locations 38, 40, the contact cutouts 34, 36 and the contact locations 30, 32.

Figure 5:
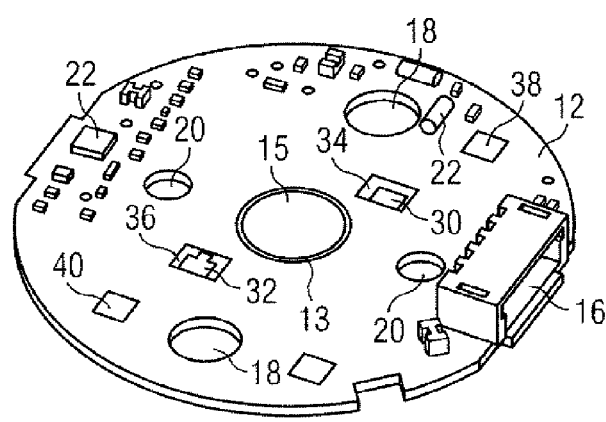
FIG. 5 shows a perspective view of one embodiment of a printed circuit board, of a carrier element and of an optoelectronic component.

FIG. 5 shows a perspective view of one embodiment of a printed circuit board 12 and of an optoelectronic component 15. The printed circuit board 12 and the optoelectronic component 15 can for example largely correspond to one of the printed circuit boards 12 explained above and respectively to an optoelectronic component 15 explained above. By way of example, the printed circuit board 12 and the optoelectronic component 15 can largely correspond to the printed circuit board 12 shown in FIG. 4 and respectively to the optoelectronic component 15 shown in FIG. 4, wherein the carrier element 11 is largely covered by the printed circuit board 12 in FIG. 5.

In the embodiment shown in FIG. 5, the central cutout 13 of the printed circuit board and the optoelectronic component 15 are formed in a manner corresponding to one another with a smaller diameter relative to the entire printed circuit board 12 than in the embodiment shown in FIG. 4. Furthermore, the contact cutouts 34, 36 are formed in a rectangular fashion, for example. FIG. 5 furthermore reveals that, with the carrier element 11 fixed to the printed circuit board 12, the contact locations 30, 32 are exposed in the corresponding contact cutouts 34, 36.

Furthermore, the printed circuit board 12 has optional fixing cutouts 20 of the printed circuit board 12 for the purpose of fixing the housing body 14 to the printed circuit board 12, into which fixing cutouts fixing pins (not shown in FIG. 5) of the housing body 14 are insertable.

Figure 6:
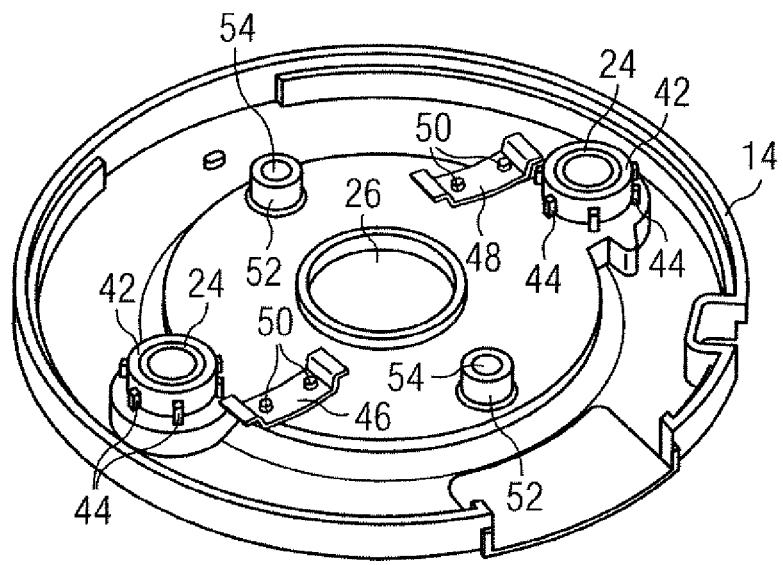
FIG. 6 shows a perspective view of one embodiment of an inner side of a housing body.

FIG. 6 shows an inner side of one embodiment of a housing body which, for example, can be used in conjunction with the printed circuit board 12 shown in FIG. 5 and/or which can correspond to one of the housing bodies 14 explained above.

The housing body 14 has the mounting cutouts 24, wherein the mounting cutouts 24 are delimited by walls 42 of the mounting cutouts 24. The walls 42 can for example be formed integrally with the housing body 14 or be fixed thereto.

The walls optionally have mounting ribs 44 on their external circumference, which mounting ribs enlarge the external circumference of the walls 42 in the corresponding individual sections of the walls 42. By way of example, the walls 42 and the mounting ribs 44 can be formed in such a way that external circumferences of the walls 42 between the mounting ribs 44 are formed with a clearance fit with respect to the mounting cutouts 18 of the printed circuit board 12, such that the walls 42 are insertable into the mounting cutouts 18 in a simple manner. In the region of the mounting ribs 44, the external circumference of the walls 42 can be enlarged in such a way that interference fits with respect to the mounting cutouts 18 of the printed circuit board 12 are formed in the region of the mounting ribs 44. This has the effect that when the walls 42 are inserted into the mounting cutouts 18 of the printed circuit board 12, a force-locking connection arises by a press fit between the walls 42 and the printed circuit board 12 and thus between the printed circuit board 12 and the housing body 14.

Optionally, the connection between the housing body 14 and the printed circuit board 12 can be reinforced further, for example by an additional force-locking connection. For this purpose, by way of example, fixing pins 52 are arranged on the inner side of the housing body 14. The fixing pins 52 are formed and arranged in such a way that they are arranged at least partly in the fixing cutouts 20 of the printed circuit board 12 when the housing body 14 is arranged on the printed circuit board 12 as intended. The fixing pins 52 can have for example a slight interference fit with respect to the fixing cutouts 20, such that the force-locking connection already arises when the fixing pins 52 are inserted into the fixing cutouts 20. As an alternative thereto, the fixing pins 52 can be formed for example by a clearance fit with respect to the fixing cutouts 20 and with a length such that, when the housing body 14 is arranged as intended, they can be guided through the fixing cutouts 20 in a simple manner and project from the fixing cutouts 20 at the second side of the printed circuit board 12. The part of the fixing pins 52 which then projects through the printed circuit board 12 can be deformed, such that a positively locking connection arises between the housing body 14 and the printed circuit board 12 and the fixing pins 52 can no longer be drawn back through the fixing cutouts 20 without destruction. This deformation can be carried out by hot embossing (hot stamp), for example.

Contact elements, in particular a first contact element 46 and a second contact element 48, are arranged on the inner side of the housing body 14. The contact elements 46, 48 can be fixed to the inner side of the housing body 14 for example in each case by holding pins 50. Optionally, the contact elements 46, 48 can be fixedly adhesively bonded to the housing body 14. The contact elements 46, 48 are formed and arranged in such a way that, when the housing body 14 is arranged on the printed circuit board 12 as intended, they electrically couple a respective contact location 30, 32 of the carrier element 11 to a respective connection location 38, 40 of the printed circuit board 12. In other words, the contact elements 46, 48 serve for electrically connecting the contact locations 30, 32 to the connection locations 38, 40. By way of example, the first contact element 46 can electrically couple the first contact location 36 to the first connection location 40 and/or the second contact element 48 can electrically couple the second contact location 32 to the second connection location 40. In this case, the electrical coupling of the contact locations 30, to the connection locations 38, 40 is carried out automatically when the housing body 14 is arranged on the printed circuit board 12, and does not require any further work steps or connecting means, such as cables, wires and/or soldering connections, for example.

Figure 7:
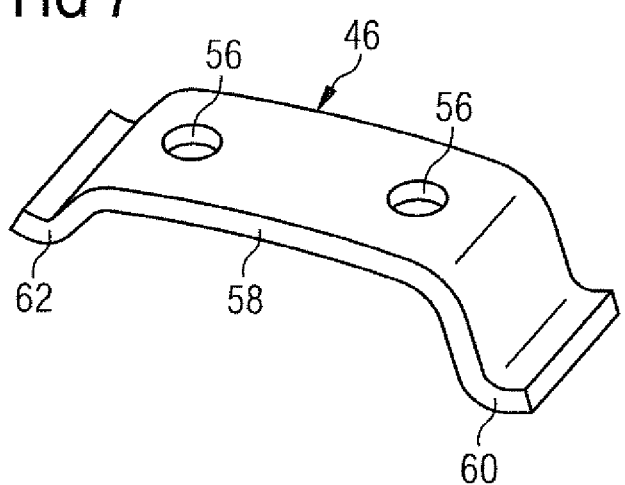
FIG. 7 shows a perspective view of one embodiment of a contact element.

FIG. 7 shows a perspective view of one embodiment of one of the contact elements, for example of the first contact element 46. The second contact element 48 can be formed in a manner corresponding to the first contact element 46, for example. The first contact element 46 has at least one holding cutout, for example two holding cutouts 56. The holding cutouts 56 are formed and arranged in such a way that the holding pins 50 are insertable into them. By way of example, the holding pins 50 can be formed with an interference fit with respect to the holding cutouts 56 of the first contact element 46, such that a force-locking connection, in particular by a press fit, between the first contact element 46 and the housing body 14 is already effected when the holding pins 50 are inserted into the holding cutouts 56 of the first contact element 46. As an alternative thereto, the holding pins 50 can be formed with a clearance fit with respect to the holding cutouts 56 of the first contact element 46 and can be formed with a length such that they project through the corresponding holding cutout 56 of the first contact element 46 when the first contact element 46 is arranged on the housing body 14 as intended. The projecting part of the corresponding holding pin 50 can then be deformed in such a way that it can no longer be drawn back through the corresponding holding cutout 56 of the first contact element 46. By way of example, after deformation, the deformed part of the holding pin 50 can have a distinct interference fit with respect to the corresponding holding cutout 56 of the first contact element 46.

The first contact element 46 can have for example a middle section 58, a first end section 60 and a second end section 62. The first contact element 46, in the state arranged on the housing body 14, for example at the middle section 58, can be in contact with the inner side of the housing body 14. The end sections 60, 62 then in each case project from the inner side of the housing body 14. The end sections 60, 62 can be bent away from the middle section 58, for example in such a way that the first contact element 46 is elastically deformed upon the pressing of the end sections 60, 62 in the direction toward the housing body 14, as a result of which a spring effect arises and the first contact element 46 is formed as a spring element. In particular, the end sections 60, 62 can be arranged in such a way that, when the housing body 14 is arranged on the printed circuit board 12 as intended, the first contact location 30 exhibits a pressure on the first end section 60 and the first connection location 38 exerts a pressure on the second end section 62 and the two end sections 60, 62 are elastically deformed, wherein the end sections 60, 62 exerts a counterpressure on the corresponding contact location 30 and connection location 38, respectively. This can contribute to a particularly reliable electrical coupling being realized between the corresponding contact location 30 and connection location 38.

The first contact element 46 can for example include metal or be formed therefrom. By way of example, the first contact element 46 can include an alloy. By way of example, the alloy can be corrosion-resistant. By way of example, the first contact element 46 can include a metal core coated with an alloy.

The contact elements 46, 48 can be formed in each case as a stamped and bent part, for example.

Figure 8:
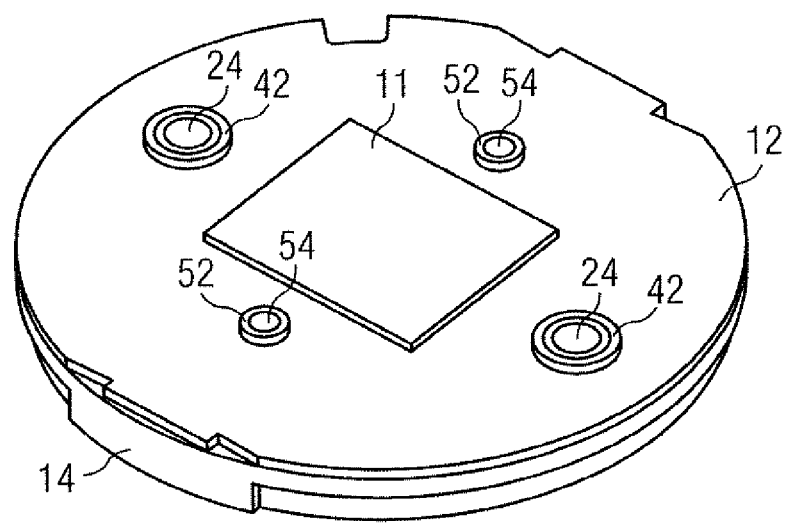
FIG. 8 shows a perspective view of an underside of one embodiment of an optoelectronic assembly.

FIG. 8 shows an underside of one embodiment of an optoelectronic assembly 10. The optoelectronic assembly 10 can be formed for example by the printed circuit board 12 shown in FIG. 5 and the corresponding optoelectronic component 15 and the housing body 14 shown in FIG. 6.

FIG. 8 reveals that the fixing pins 52 and the walls 42 of the mounting cutouts 24 project from the printed circuit board 12 at the second side of the printed circuit board 12. By way of example, the fixing pins 52 and the walls 42 can project through the printed circuit board 12 in such a way that the end sections thereof are formed flush with the second side of the carrier element 11.

Optionally, the fixing pins 52 can have cutouts 54 of the fixing pins 52. The cutouts 54 of the fixing pins 52 can serve for receiving screws, for example. The screws can contribute to the printed circuit board 12 being secured releasably on the housing body 14. With use of the screws, the fixing pins 52 can be formed in such a way that, rather than the fixing pins 52 themselves, the upper ends of the heads of the screws used are flush with the second side of the carrier element 11.

Figure 9:
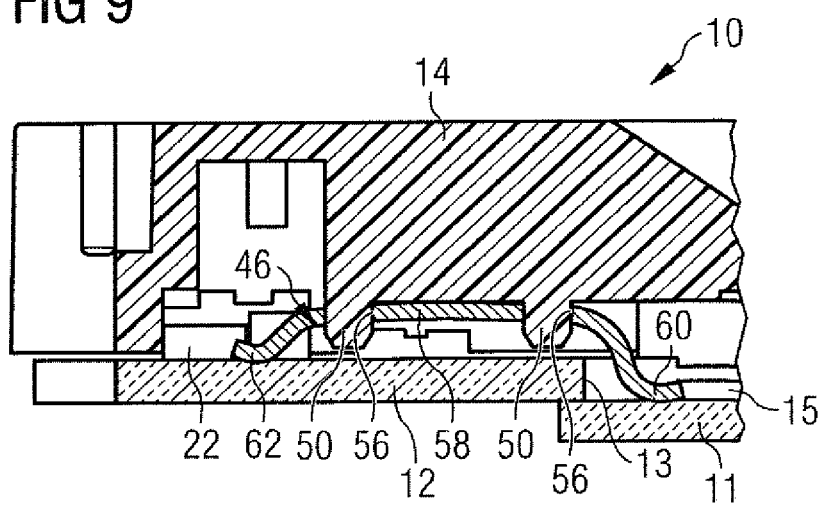
FIG. 9 shows a sectional illustration through one embodiment of an optoelectronic assembly.

FIG. 9 shows a sectional illustration through a part of one embodiment of an optoelectronic assembly, for example of the optoelectronic assembly 10, which is formed by the printed circuit board 12 shown in FIG. 5 and the corresponding optoelectronic component 15 and the housing body 14 shown in FIG. 6.

In particular, FIG. 9 shows how, with the housing body 14 arranged on the printed circuit board 12 as intended, the first contact element 46 electrically couples the first contact location 30 to the first connection location 38, wherein the first end section 60 is in physical contact with the first contact location 30 of the carrier element 11 and the second end section 62 is in physical contact with the first connection location 38 of the printed circuit board 12.

Furthermore, FIG. 9 shows how, with the first contact element 46 arranged on the housing body 14 as intended, the holding pins 50 project through the holding cutouts 56 of the first contact element 46 and how, with the housing body 14 arranged on the printed circuit board 12 as intended, the first contact element 46 is elastically deformed on account of the pressure of the printed circuit board 12 and of the carrier element 11 in the direction toward the housing body 14.

FIG. 10 shows a sectional illustration through one embodiment of an optoelectronic assembly 10, which for example can largely correspond to the optoelectronic assembly 10 illustrated in FIG. 9, wherein, in contrast thereto, the printed circuit board 12 has a holding cutout 64 of the printed circuit board 12 and one of the holding pins 50 is formed and arranged in such a way that it projects not only through the holding cutout 56 of the first contact element 46 but also through the holding cutout 64 of the printed circuit board 12. The corresponding holding pin 50 can be deformed at its end section projecting through the printed circuit board 12 in such a way that it can no longer be drawn back through the holding cutout 64 of the printed circuit board 12 without destruction. A positively locking and/or non-releasable connection between the housing body 14 and the printed circuit board 12 can be produced as a result. The deformation of the holding pin 50 can be effected by hot embossing, for example.

FIG. 11 shows a perspective view of an inner side of a housing body 14 and of a second side of a printed circuit board 12, which for example can largely correspond to the housing body 14 shown in FIG. 6 and the printed circuit board 12 shown in FIG. 5. In contrast thereto, however, the contact locations 30, 32, the corresponding contact cutouts 34, 36, the corresponding connection locations 38, 40 and the corresponding contact elements 46, 48 are arranged differently relative to the mounting cutouts 42 and fixing pins 52. Furthermore, the optoelectronic component 15 is formed somewhat larger relative to the printed circuit board 12 and the central cutout 13 of the printed circuit board 12 is correspondingly formed larger.

Furthermore, optionally, the contact cutouts 34, 36 open into the central cutout 13 of the printed circuit board 12. In other words, the central cutout 13 and the contact cutouts 34, 36 are formed integrally. In still other words, the contact cutouts 34, 36 and the central cutout 13 form a common large cutout.

FIG. 12 shows an inner side of one embodiment of a housing body 14 and a second side of one embodiment of a printed circuit board 12, which for example can largely correspond to the housing body 14 shown in FIG. 11 and the printed circuit board 12 shown in FIG. 11. In contrast thereto, however, the optoelectronic component 15 is formed larger and the central cutout 13 of the printed circuit board 12 is correspondingly formed larger. Furthermore, the fixing pins 53 have been dispensed with in the embodiment shown in FIG. 12.

Light having different lumen values can be generated by the optoelectronic assemblies 10. By way of example, lumen values in the range of for example 500 lumens to 1500 lumens, for example 600 lumens to 1000 lumens, for example approximately 800 lumens, can be achieved by the optoelectronic component 15 shown in FIG. 5 and the corresponding printed circuit board 12. By way of example, light having lumen values in the range of 1500 lumens to 2500 lumens, for example in the range of 1900 to 2100 lumens, for example approximately 2000 lumens, can be achieved with the optoelectronic component 15 shown in FIG. 11 and the corresponding printed circuit board 12. By way of example, light having lumen values in the range of 4000 to 6000, for example in the range of 4500 to 5500 lumens, for example approximately 5000 lumens, can be achieved with the optoelectronic component 15 shown in FIG. 12 and the corresponding printed circuit board 12.

The present disclosure is not restricted to the embodiments specified. By way of example, more or fewer optoelectronic components 15 can be arranged in an optoelectronic assembly 10. Furthermore, the optoelectronic assemblies 10 can include more or fewer mounting cutouts 24. Furthermore, the optoelectronic assemblies 10 and in particular the housing bodies 14 can have different external shapes. By way of example, the optoelectronic assemblies 10 can be formed in an angular fashion, for example in a rectangular or square fashion.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic assembly comprising:
a printed circuit board, which has a first side of the printed circuit board, a second side of the printed circuit board facing away from the first side, a central cutout of the printed circuit board, at least one contact cutout and, on the first side of the printed circuit board, at least one connection location,
a carrier element, which is physically coupled to the printed circuit board, has a first side of the carrier element, said first side facing the second side of the printed circuit board, and has at least one contact location on the first side of the carrier element, wherein the contact location is exposed in the contact cutout of the printed circuit board,
at least one optoelectronic component which is electrically coupled to the contact location of the carrier element via the carrier element and which is arranged on the first side of the carrier element in such a way that it is exposed in the central cutout of the printed circuit board,
a housing body, which has a central cutout and which is formed and physically coupled to the printed circuit board in such a way that the optoelectronic component is exposed in the central cutout of the housing body, and
at least one contact element which is arranged on an inner side of the housing body and is formed in such a way that the contact element electrically couples the contact location of the carrier element to the connection location of the printed circuit board;
wherein the contact element has a middle section, via which the contact element is fixed to the housing body, a first end section, which projects from the housing body and which is coupled to the contact location of the carrier element, and a second end section, which projects from the housing body and which is coupled to the connection location of the printed circuit board.

2. The optoelectronic assembly as claimed in claim 1, wherein the contact element is formed as a spring element.

3. The optoelectronic assembly as claimed in claim 1, wherein the housing body has at least one holding pin on its inner side, and wherein the contact element has at least one holding cutout of the contact element, and wherein the holding pin projects through the holding cutout of the contact element.

4. The optoelectronic assembly as claimed in claim 3, wherein the printed circuit board has a holding cutout of the printed circuit board, and wherein the holding pin projects through the holding cutout of the printed circuit board.

5. The optoelectronic assembly as claimed in claim 3, wherein the part of the holding pin which projects through the holding cutout of the contact element is formed with an interference fit with respect to the holding cutout of the contact element, and/or wherein the part of the holding pin which projects through the holding cutout of the printed circuit board is formed with an interference fit with respect to the holding cutout of the printed circuit board.

6. The optoelectronic assembly as claimed in claim 5, wherein the holding pin projects through the holding cutout of the printed circuit board to an extent such that an end section of the holding pin is flush with a second side of the carrier element facing away from the first side of the carrier element.

7. The optoelectronic assembly as claimed in claim 1, wherein the housing body has at least one mounting cutout of the housing body which is formed in such a way that a wall of the mounting cutout of the housing body projects through a mounting cutout of the printed circuit board.

8. The optoelectronic assembly as claimed in claim 7, wherein the wall projects through the mounting cutout of the printed circuit board to an extent such that an end section of the wall is flush with a second side of the carrier element facing away from the first side of the carrier element.

9. The optoelectronic assembly as claimed in claim 7, wherein mounting ribs are formed on an outer side of the wall, wherein the outer side of the wall between the mounting ribs is formed with a clearance fit with respect to the mounting cutout of the printed circuit board, and the mounting ribs are formed in accordance with an interference fit with respect to the mounting cutout of the printed circuit board.

10. The optoelectronic assembly as claimed in claim 1, wherein the housing body has on its inner side at least one fixing pin which is formed in such a way that it projects through a fixing cutout of the printed circuit board.

11. The optoelectronic assembly as claimed in claim 10, wherein the fixing pin projects through the fixing cutout of the printed circuit board to an extent such that an end section of the fixing pin is flush with a second side of the carrier element facing away from the first side of the carrier element.

12. The optoelectronic assembly as claimed in claim 1, wherein the contact cutout opens into the central cutout of the printed circuit board.

13. A method for producing an optoelectronic assembly comprising:
providing a carrier element which has a first side of the carrier element and at least one contact location on the first side of the carrier element,
arranging at least one optoelectronic component on the first side of the carrier element and is electrically coupled to the two contact locations via the carrier element,
providing a printed circuit board which has a first side of the printed circuit board, a second side of the printed circuit board facing away from the first side of the printed circuit board, a central cutout, at least one contact cutout and, on the first side of the printed circuit board, at least one connection location,
wherein the carrier element is physically coupled to the printed circuit board in such a way that the first side of the carrier element faces the second side of the printed circuit board, that the optoelectronic component is exposed in the central cutout of the printed circuit board, and that the contact location of the carrier element is exposed in the contact cutout of the printed circuit board, and
providing a housing body which has a central cutout and on the inner side of which at least one electrically conductive contact element is arranged,
the housing body is physically coupled to the printed circuit board in such a way that the optoelectronic component is exposed in the central cutout of the housing body, and the contact element electrically couples the contact location of the carrier element to the connection location of the printed circuit board;
wherein the carrier element couples the contact location to the connection location by fixing the contact element to the housing body via a middle section of the contact element,
coupling a first end section of the contact element, which projects from the housing body, to the contact location of the carrier element, and
coupling a second end section of the contact element, which projects from the housing body, to the connection location of the printed circuit board.

14. The method as claimed in claim 13, wherein the contact element is fixed to the housing body by a holding pin of the housing body and a holding cutout of the contact element corresponding thereto.

15. An optoelectronic assembly comprising:
a printed circuit board, which has a first side of the printed circuit board, a second side of the printed circuit board facing away from the first side, a central cutout of the printed circuit board, at least one contact cutout and, on the first side of the printed circuit board, at least one connection location,
a carrier element, which is physically coupled to the printed circuit board, has a first side of the carrier element, said first side facing the second side of the printed circuit board, and has at least one contact location on the first side of the carrier element, wherein the contact location is exposed in the contact cutout of the printed circuit board,
at least one optoelectronic component which is electrically coupled to the contact location of the carrier element via the carrier element and which is arranged on the first side of the carrier element in such a way that it is exposed in the central cutout of the printed circuit board,
a housing body, which has a central cutout and which is formed and physically coupled to the printed circuit board in such a way that the optoelectronic component is exposed in the central cutout of the housing body, and
at least one contact element which is arranged on an inner side of the housing body and is formed in such a way that the contact element electrically couples the contact location of the carrier element to the connection location of the printed circuit board;

wherein the housing body has at least one holding pin on its inner side, and wherein the contact element has at least one holding cutout of the contact element, and wherein the holding pin projects through the holding cutout of the contact element;

wherein the printed circuit board has a holding cutout of the printed circuit board, and wherein the holding pin projects through the holding cutout of the printed circuit board.

\* \* \* \* \*